(12) United States Patent
Geynet et al.

(10) Patent No.: US 7,312,670 B2
(45) Date of Patent: Dec. 25, 2007

(54) VOLTAGE CONTROLLED OSCILLATOR

(75) Inventors: Lionel Geynet, Fontanes (FR); Emeric De Foucauld, Seyssinet (FR)

(73) Assignee: Commissariat a l'Energie Atomique, Paris (FR)

( * ) Notice: Subject to any disclaimer, the term of this patent is extended or adjusted under 35 U.S.C. 154(b) by 91 days.

(21) Appl. No.: 11/143,461

(22) Filed: Jun. 3, 2005

(65) Prior Publication Data

US 2005/0275474 A1 Dec. 15, 2005

(30) Foreign Application Priority Data

Jun. 10, 2004 (FR) ................................. 04 06304

(51) Int. Cl.
*H03B 5/00* (2006.01)
(52) U.S. Cl. ..................... 331/117 FE; 331/117 R; 331/167; 331/177 V; 331/179
(58) Field of Classification Search ................. 331/16, 331/177 V, 117 FE, 117 R, 167, 179
See application file for complete search history.

(56) References Cited

U.S. PATENT DOCUMENTS

| 4,602,222 A | 7/1986 | Wynn ........................ 331/179 |
| 6,292,065 B1 | 9/2001 | Friedman et al. ....... 331/117 R |
| 6,574,288 B1 | 6/2003 | Welland et al. ............. 375/327 |
| 6,657,509 B1 | 12/2003 | Ohannes ................. 331/177 V |
| 2002/0033741 A1* | 3/2002 | Craninckx et al. ...... 331/117 R |
| 2002/0167362 A1 | 11/2002 | Justice et al. |
| 2002/0171499 A1 | 11/2002 | Momtaz et al. |
| 2003/0189466 A1 | 10/2003 | Kitamura |

FOREIGN PATENT DOCUMENTS

JP A 2004-147310 5/2004

* cited by examiner

*Primary Examiner*—Arnold Kinkead
(74) *Attorney, Agent, or Firm*—Oliff & Berridge, PLC

(57) ABSTRACT

The voltage controlled oscillator comprises an oscillating system wherein two variable capacitors are alternately connected. The capacitances of these two capacitors vary respectively in the same direction as the voltage that is applied thereto and in the opposite direction. Replacing one variable capacitor by the other is performed automatically when the output frequency of the oscillator reaches a predetermined switching value. It is thus possible to divide an operating frequency band of the oscillator into at least two parts in which the frequency varies alternately in the same direction as the control voltage of the oscillator and in the opposite direction. Switchable fixed capacitors can be connected in the oscillating system, either when one variable capacitor is replaced by the other or by means of a command, to make the oscillator switch from one frequency band to a lower band.

9 Claims, 6 Drawing Sheets

VOLTAGE CONTROLLED OSCILLATOR

BACKGROUND OF THE INVENTION

The invention relates to a voltage controlled oscillator comprising an oscillating system with a first variable capacitor having a capacitance varying according to the control voltage of the oscillator.

STATE OF THE ART

A voltage controlled oscillator (VCO) supplies oscillating signals having a frequency varying according to a control voltage signal Uc. Voltage controlled oscillators are often used in phase lock loops, as represented in FIG. 1. Such a loop conventionally comprises a voltage controlled oscillator 1 having an input connected, by means of a filter 4, to the output of a phase comparator 2 and an output, which constitutes the output of the loop, connected to a first input of the phase comparator 2, possibly by means of a frequency divider 3. Clock signals, having a predetermined reference frequency Fref and for example supplied by a quartz oscillator, are applied to a second input of the phase comparator 2.

The control voltage Uc of the oscillator is thus a function of the difference between the frequency Fs of the output signals of the oscillator 1, whereto a dividing coefficient may be assigned, and of the reference frequency Fref. When the loop is locked, the output frequency Fs is thus equal to the reference frequency Fref or to a multiple thereof.

Such a phase lock loop is used in a large number of circuits requiring frequency synthesis, in particular in the radiofrequency field, for modulated signal receipt. Several transmission standards, for example GSM, GPS or DCS type standards, standards using the Bluetooth technology or a wireless local area system (WLAN), are often used in a same receiver, in particular in portable telephones. It is then desirable to be able to switch quickly from one standard to another, for example from a GSM type standard to a Bluetooth type standard.

At present, multiband voltage controlled oscillators enable several frequency bands to be covered. A particular example of a multiband voltage controlled oscillator, described in U.S. Pat. No. 4,602,222, is illustrated in FIG. 2. It comprises a LC type oscillating system comprising a first inductor L1 and a capacitor C1 connected in series between the input and the output of the oscillator. A second inductor L2 is connected between the output of the oscillator and ground. A variable capacitor Cv, formed by a variable capacitance diode, i.e. by a diode having a capacitance varying according to the voltage applied to its terminals, is connected between the input of the oscillator and ground. A switchable capacitor C2 is connected, in series with a switch S, between the output of the oscillator and ground. Connection of the capacitor C2 in the oscillating system, by closing of the switch S, makes it possible to switch from a frequency band (F1 to F1+ΔF1) to a lower frequency band (F2 to F2+ΔF2), as represented in FIG. 3. Within each frequency band, the output frequency F of the oscillating system varies linearly with the control voltage Uc applied to the input of the oscillator, which can vary between a minimum control voltage Ucmin and a maximum control voltage Ucmax.

Other examples of multiband voltage controlled oscillators are described in the above-mentioned U.S. Pat. No. 4,602,222 and in document US-A-2002/0171499.

Thus, connecting switchable capacitors in the oscillating system of a voltage controlled oscillator makes it possible to modify the oscillation frequency and the frequency band covered. More generally, the output frequency F of the voltage controlled oscillator is a function of the inductance value L of the resonant system, of the variable capacitance Cv(Uc) of the oscillating circuit, which is a function of the controlled voltage Uc, and of the switched capacitance Ccom:

$$F = 1/(2\pi\sqrt{L(Cv(Uc)+Ccom)})$$

In a phase lock loop using a known multiband voltage controlled oscillator, switching from one frequency band to the other causes a temporary pulling out of phase of the phase lock loop. Indeed, as represented in FIGS. 4 and 5, connecting a switched capacitor Ccom at a time t1 first of all causes a reduction of the control voltage Uc, from a first stable value, and of the output frequency Fs, initially at a stable value Fs1. Then, at a time t2, the phase lock loop pulls out of synchronism, i.e. the voltage controlled oscillator no longer supplies any signal. Then, after a time which is more particularly function of the cut-off frequency of the filter 4, operation of the phase lock loop resumes and, from a time t3, the output frequency Fs increases linearly up to a stable value Fs2, lower than Fs1, while the control value Uc oscillates before reaching a second stable value.

To overcome the problem of pulling out of oscillation synchronism of a phase lock loop using a multiband voltage controlled oscillator enabling different standards to be covered, it is possible to increase the gain of the voltage controlled oscillator, i.e. the ratio K=F/Uc between the frequency F of its output signals and the control voltage Uc applied to its input, so as to cover the whole range of required frequencies without sudden switching of new capacitors.

However, the higher the gain, the greater the phase noise generated, which presents a new drawback.

OBJECT OF THE INVENTION

The object of the invention is to overcome these drawbacks and, more particularly, to achieve a voltage controlled oscillator with a reduced phase noise. In the case of a multiband oscillator, the latter must not cause pulling out of synchronism when switching from one band to another when it is arranged in a phase lock loop.

According to the invention, this object is achieved by the fact that the oscillator comprises a second variable capacitor, having a capacitance varying according to the voltage applied thereto, switching means connected to the first and second variable capacitors and control means for controlling the switching means causing, according to the output frequency of the oscillator, one of the variable capacitors to be replaced by the other in the oscillating system, the capacitance of one of the variable capacitors varying in the same direction as the voltage that is applied thereto and the capacitance of the other variable capacitor varying in the opposite direction to the voltage that is applied thereto.

According to a development of the invention, an operating frequency band of the oscillator is divided into at least two parts, in which the frequency varies alternately in the same direction as the control voltage and in the opposite direction.

According to another development of the invention, the control means comprise means for supplying to the switching means a switching signal causing changing of the variable capacitor in the oscillating system when the output frequency of the oscillator reaches a predetermined switching value, corresponding to the maximum oscillation frequency of the oscillating system with one of the variable capacitors.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

A voltage controlled oscillator according to the invention comprises an oscillating system or oscillating circuit in which two variable capacitors Cv+ and Cv− are alternately connected. The capacitances of the two variable capacitors vary in opposite directions with respect to the voltage that is applied thereto.

Figure 6:
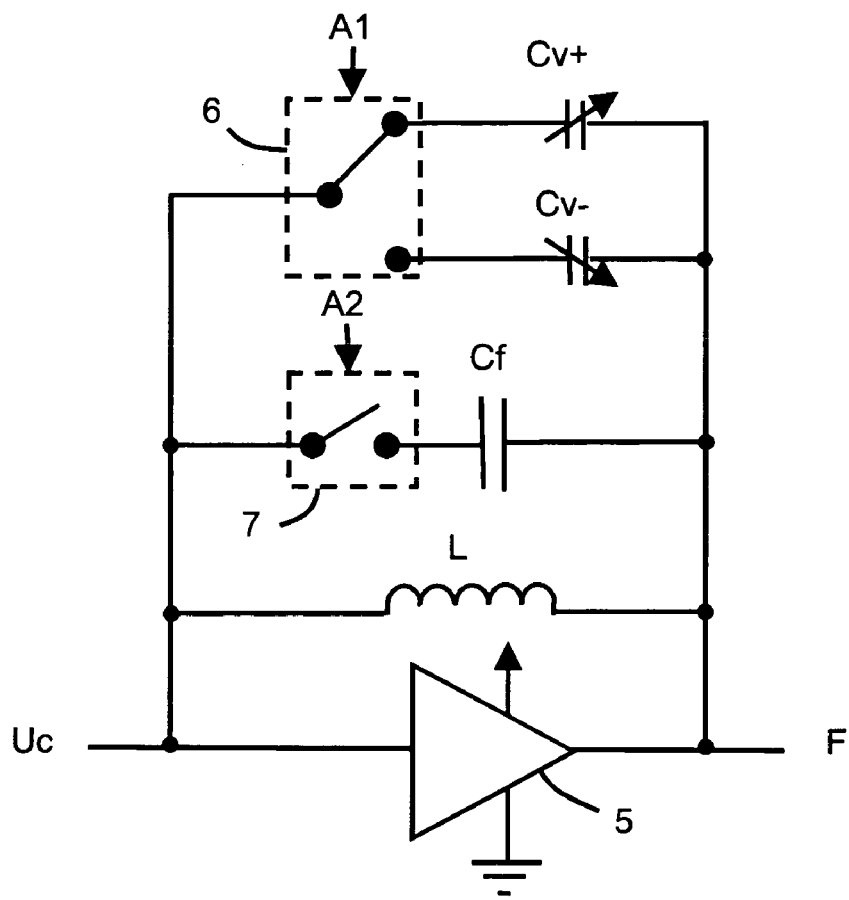
FIG. 6 represents a particular embodiment of an oscillator according to the invention.

In the particular embodiment represented in FIG. 6, the oscillating system comprises an amplifier 5 connected in parallel with an inductor L between the control input and the output of the oscillator. The two variable capacitors Cv+ and Cv− are connected, in series with a changeover switch 6, between the input and output of the oscillator. The changeover switch 6 is controlled by control signals A1 supplied by a control circuit (not shown) so as to alternately connect the variable capacitors Cv+ and Cv− in parallel with the inductor L, according to the output frequency of the oscillator.

In a particular embodiment, the changeover switch 6 comprises a common terminal connected to one end of the inductor L, for example to the input of the oscillator in FIG. 6, and two terminals respectively connected to first ends of the variable capacitors Cv+ and Cv−. In an alternative embodiment, not represented, two switches connected in series respectively with the variable capacitors Cv+ and Cv− are controlled by complementary signals so that one of the switches is open when the other one is closed.

The minimum oscillating frequency Fmin of the oscillator corresponds to the oscillation frequency, at the minimum control voltage Ucmin, of the resonant system LC. The capacitance of the resonant system then corresponds to the intrinsic maximum value of the variable capacitor initially connected in the oscillating system, possibly combined with the capacitance of a non-switchable fixed capacitor of the oscillating system:

$$F\min=F(Cv-, Uc\min).$$

Figure 7:
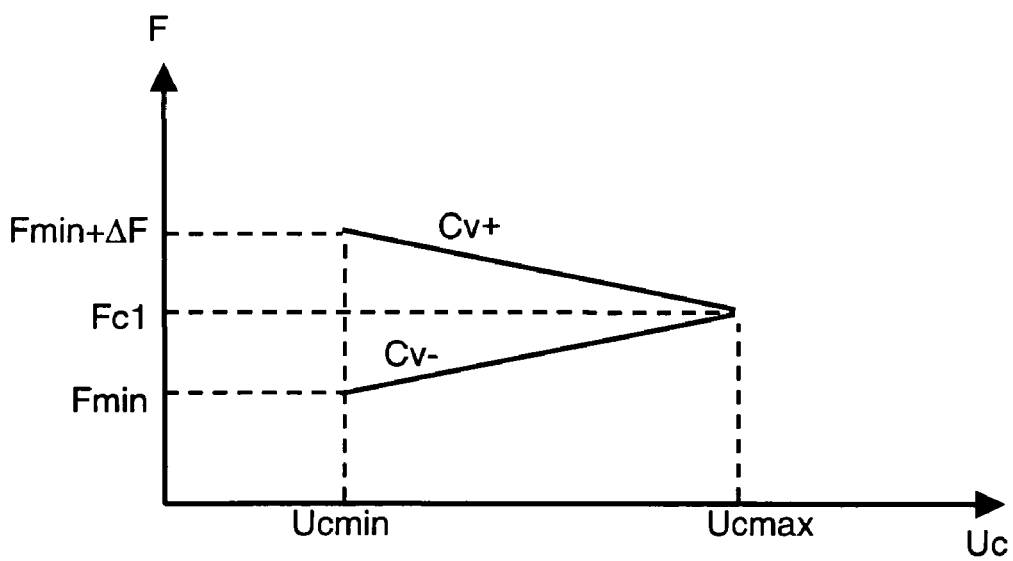
FIG. 7 illustrates the variations of the output frequency F of an oscillator according to the invention versus its control voltage Uc.

Thus, as represented in FIG. 7, when only the capacitor Cv−, having a capacitance varying in the opposite direction to its control voltage, is initially connected in parallel with the inductor L, the output frequency F of the oscillator 6 increases linearly with the control voltage Uc between the minimum oscillation frequency Fmin and a predetermined switching value Fc1. The switching value Fc1 corresponds to the maximum output frequency obtained, in this configuration, with the maximum voltage Ucmax of the control frequency Uc:

$$Fc1=F(Cv-, Uc\max).$$

When the output frequency F of the oscillator reaches the switching value Fc1, the control circuit supplies a switching signal A1 to the changeover switch 6 automatically causing the capacitor Cv− to be replaced by the capacitor Cv+ in the oscillating system. The respective characteristics of the capacitors Cv− and Cv+ are such that F(Cv−, Ucmax)=F(Cv+, Ucmax). There is therefore neither any modification of the oscillation frequency of the oscillator nor any sudden modification of the control voltage Uc at the time the capacitor Cv− is replaced by the capacitor Cv+ and vice-versa. The output frequency F of the oscillator 6 then continues, when the control voltage Uc decreases, to increase linearly between the switching value Fc1 and an oscillation frequency Fmin+ΔF=F(Cv+, Ucmin).

The voltage controlled oscillator thus covers an operating frequency band ΔF comprised between Fmin=F(Cv−, Ucmin) and Fmin+ΔF=F(Cv+, Ucmin) and divided into two parts, in which the frequency varies alternately in the same direction as the control voltage and in the opposite direction, on each side of the switching frequency Fc1. This enables the gain K of the oscillator to be reduced and thus the phase noise in the oscillator to be reduced.

The capacitor Cv+ can be initially connected in the oscillating system instead of the capacitor Cv−. In this case, the set-up is reversed. The minimum frequency of the oscillator is then given by F(Cv+, Ucmax) and, so long as the control voltage Uc decreases, the oscillation frequency increases up to the switching frequency F(Cv+, Ucmin), corresponding to the maximum oscillation frequency of the system with the variable capacitor Cv+. The latter is then replaced by the capacitor Cv−, with F(Cv+, Ucmin)=F(Cv−, Ucmin). The frequency then continues to increase, with the control voltage, until the output frequency of the oscillator reaches the value F(Cv−, Ucmax).

Figure 8:
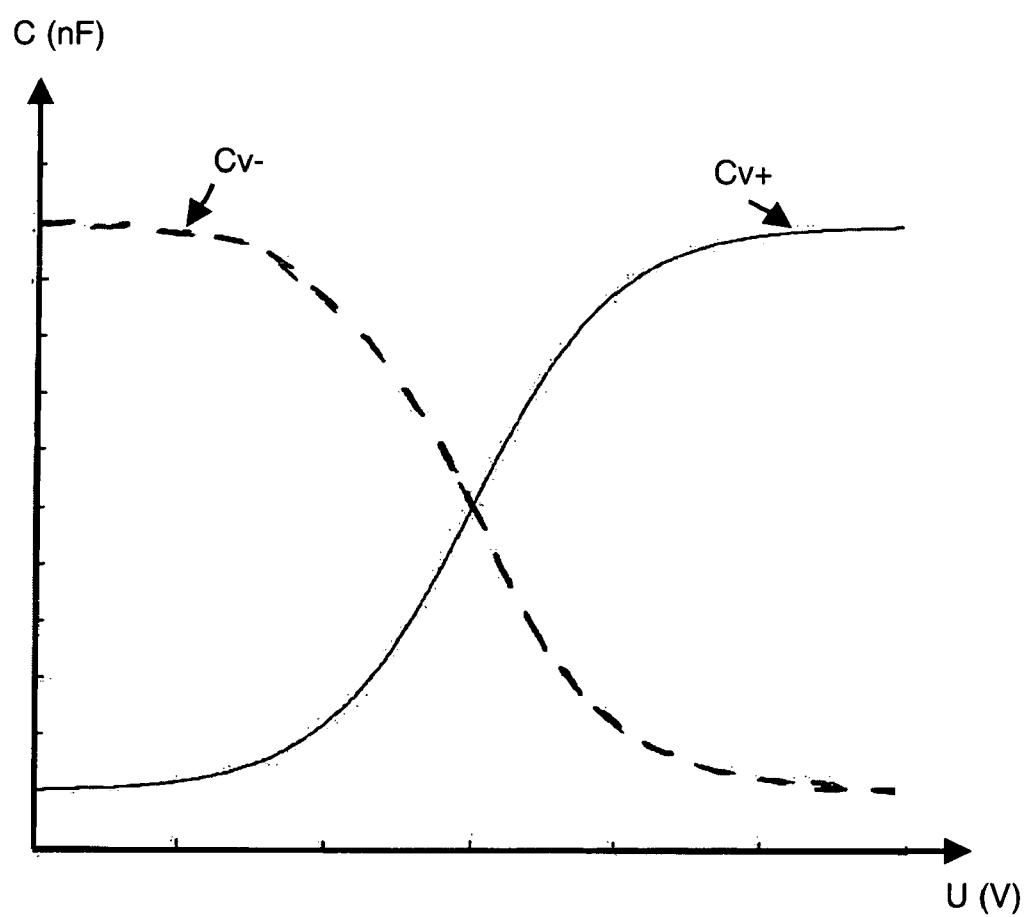
FIG. 8 illustrates the variations of the capacitance of variable capacitors Cv+ and Cv− able to be used in an oscillator according to the invention, versus the control voltage U that is applied to their terminals.

The variable capacitors Cv+ and Cv− can be formed by any suitable means and, more particularly, by varactors of diode type or of transistor type (PMOS and NMOS), or by MEMS-based capacitors. FIG. 8 illustrates an example of the capacitance variations of variable capacitors Cv− and Cv+, respectively constituted by NMOS and PMOS transistors, versus the voltage U that is applied to the terminals thereof.

As represented in FIG. 6, the oscillator can also comprise at least one additional capacitor Cf, having a fixed capacitance, connected in series with an additional changeover switch 7 to the terminals of the inductor L.

Figure 9:
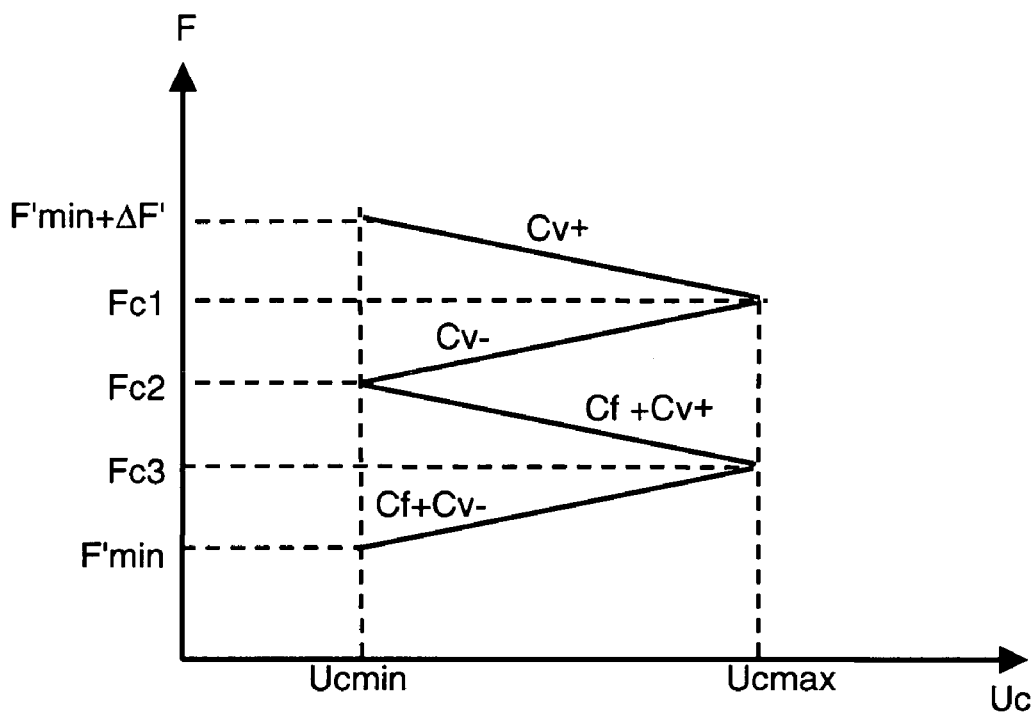
FIGS. 9 and 10 illustrate the variations of the output frequency F of an oscillator versus its control voltage Uc, respectively for two particular embodiments of an oscillator according to the invention comprising switchable capacitors.

In a first alternative embodiment, illustrated in FIG. 9, the oscillating system initially comprises the capacitor Cv+ only. The initial frequency, at the control voltage Ucmin, then corresponds to the maximum frequency F'min+ΔF'=F(Cv+, Ucmin). As previously, the frequency decreases linearly, when the control voltage Uc increases, up to the switching frequency Fc1=F(Cv+, Ucmax)=F(Cv−, Ucmax). When the frequency reaches the switching value Fc1, the capacitor Cv+ is replaced by the capacitor Cv−. The output frequency F of the oscillator then continues, when the control voltage Uc decreases, to decrease linearly between the switching value Fc1 and a switching value Fc2=F(Cv−, Ucmin). The additional capacitor Cf is connected in the oscillating system when the output frequency F of the oscillator reaches the switching value Fc2. The control circuit then simultaneously supplies a switching signal A1 to the changeover switch 6 and a switching signal A2 to the additional changeover switch 7. In the particular embodiment illustrated in FIGS. 6 to 9, the additional capacitor Cf is thus connected in the oscillating system by closing of the changeover switch 7, when the output frequency of the oscillator reaches the switching frequency Fc2, which simultaneously causes the capacitor Cv− to be replaced by the capacitor Cv+. The capacitance value of the fixed capacitor Cf is chosen in such a way that connection of the capacitor Cf and simultaneous replacement of Cv− by Cv+ does not modify either the output frequency of the oscillator or the control voltage. For this, the maximum oscillation frequency of the oscillating system with the fixed capacitor Cf is equal to the minimum oscillation frequency of the oscillating system without this capacitor:

$$Fc2=F(Cv-, Uc\text{ min})=F(Cf\text{ and }Cv+, Uc\text{ min}).$$

The combination of connection of the capacitor Cf in the system and of the new reversal of the direction of variation of the variable capacitor according to the control voltage thus enables the oscillator output frequency to continue to decrease, while the control voltage increases up to a switching value Fc3, which then causes the capacitor Cv+ to be replaced by the capacitor Cv−, with: Fc3=F(Cf and Cv+, Ucmax)=F(Cf and Cv−, Ucmax).

The frequency then continues to decrease with the control voltage, down to a frequency F'min=F(Cf and Cv−, Ucmin). The frequency band ΔF' is thus divided into four parts in which the frequency varies alternately in the opposite direction to the control voltage and in the same direction, alternation being caused each time the output frequency reaches a switching value Fc1, Fc2 or Fc3.

The oscillator can comprise several switchable fixed capacitors. A first fixed capacitor Cf1 being, as above, connected in the oscillating system when the output frequency of the oscillator reaches the switching value Fc2=F(Cv−, Ucmin)=F(Cf1 and Cv+, Ucmin), a second fixed capacitor Cf2 can be connected in the oscillating system when the frequency reaches a switching value F(Cf1 and Cv−, Ucmin)=F(Cf1, Cf2 and Cv+, Ucmin).

Other fixed changeover switches Cfi, with i=1 to n, can thus be selectively connected in the oscillating system when the frequency F reaches corresponding switching values F(Cf1, Cf2 . . . Cfi and Cv−, Ucmin)=F(Cf1, Cf2 . . . Cfi and Cv+, Ucmin). The frequency band can thus be divided into 2n+2 parts.

If the variable capacitor initially connected in the oscillating system when the frequency is at the maximum (F'min+ΔF') is the capacitor Cv− instead of the capacitor Cv+, connection in the system of a fixed capacitor Cfi is performed when the frequency reaches a switching frequency F(Cf1, Cf2 . . . Cfi−1 and Cv+, Ucmax)=F(Cf1, Cf2 . . . Cfi and Cv−, Ucmax).

Figure 10:
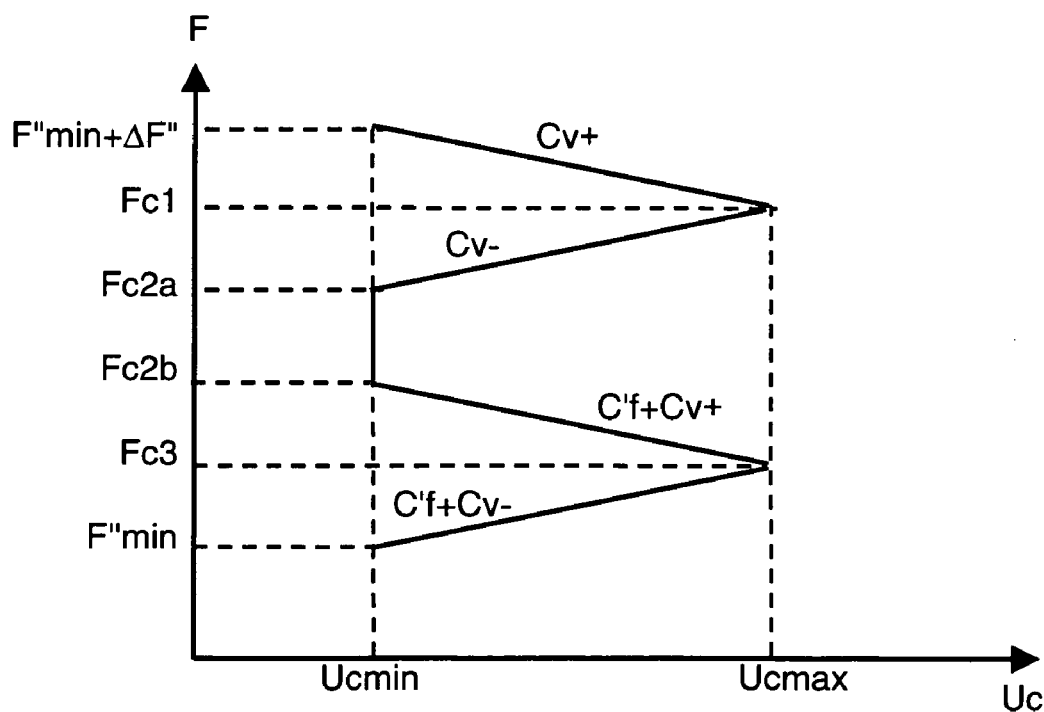

In the alternative embodiment illustrated in FIGS. 6 and 10, the capacitance value of the fixed capacitor C'f is chosen such that connection in the system of the capacitor C'f and simultaneous replacement of Cv+ by Cv−, when the frequency reaches a switching value Fc2a=F(Cv−, Ucmin) causes a frequency jump. The output frequency of the oscillator then switches from the frequency Fc2a, corresponding to the minimum oscillation frequency of the oscillating system without the fixed capacitor C'f, to a value Fc2b=F(C'f and Cv+, Ucmin), lower than Fc2a and corresponding to the maximum oscillation frequency of the oscillating system with the fixed capacitor C'f. In the opposite way, removing the fixed capacitor C'f when the output frequency of the oscillator increases again to the value F2b and simultaneous replacement of Cv+ by Cv− makes the output frequency of the oscillator go to the value Fc2a. In both cases, the control voltage remains at its value Ucmin during switching.

As previously, the oscillator can comprise several switchable fixed capacitors C'fi, with i=1 to n, selectively connected in the oscillating system or selectively removed from the latter. A capacitor C'fi is thus connected in the oscillating system when the frequency F reaches the switching value F(C'f1, C'f2 . . . C'fi−1 and Cv−, Ucmin), then making the frequency F go to a lower value F(C'f1, C'f2 . . . C'fi and Cv+, Ucmin).

The alternative embodiment illustrated in FIG. 10 can be used both within a frequency band, between F"min and F"min+ΔF", as described above, and to achieve a multiband voltage controlled oscillator. The latter then makes it possible to switch from a first frequency band, comprised between F1=Fc2a and F1+ΔF1=F"min+ΔF", to a second frequency band, lower than the first one, comprised between F2=F"min and F2+ΔF2=Fc2b, and vice-versa. In this case, the switching signals A2 controlling connection of the switchable fixed capacitors in the system are not supplied by the control circuit at the same time as the control signals A1 of the changeover switch A1, but can be applied at any time either by a manual command from the user or by a remote control.

More generally, the oscillator can enable switching from a frequency band comprised between Fi and Fi+ΔFi to a lower frequency band comprised between F(i+1) and F(i+1)+ΔF(i+1) by replacing one variable capacitor by the other and simultaneous connection in the system of a fixed capacitor C'fi, with i=1 to n, having a capacitance which is such that the difference between the lower frequency F(i−1) of a frequency band and the upper frequency Fi+ΔFi of the band immediately below is given by:

$$F(i-1)-(Fi+\Delta Fi)=F(C'f1, C'f2 \ldots C'fi-1\text{ and }Cv-, Uc\text{ min})-F(C'f1, C'f2 \ldots C'fi\text{ and }Cv+, Uc\text{ min})$$

with $$\Delta Fi=F(C'f1, C'f2 \ldots C'fi\text{ and }Cv+, Uc\text{ min})-F(C'f1, C'f2 \ldots C'fi\text{ and }Cv-, Uc\text{ min})$$

As previously, connection of the fixed capacitors in the system can be performed either when Cv− is replaced by Cv+, at Ucmin, or when Cv+ is replaced by Cv−, at Ucmax.

Figure 1:
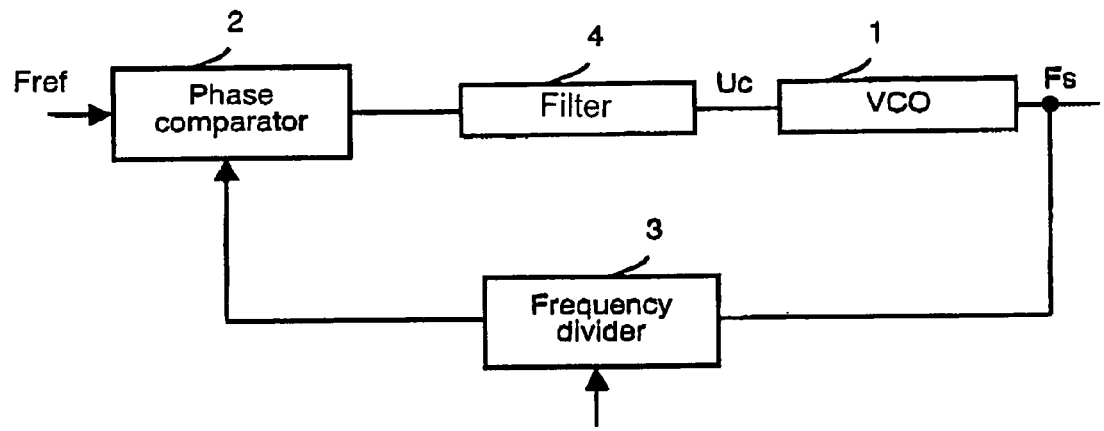
FIG. 1 schematically represents a phase lock loop of conventional type.
Figure 2:
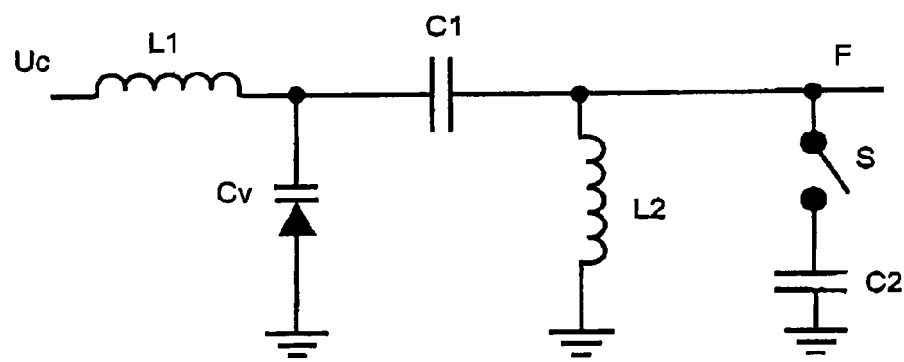
FIG. 2 illustrates a multiband voltage controlled oscillator according to the prior art.
Figure 3:
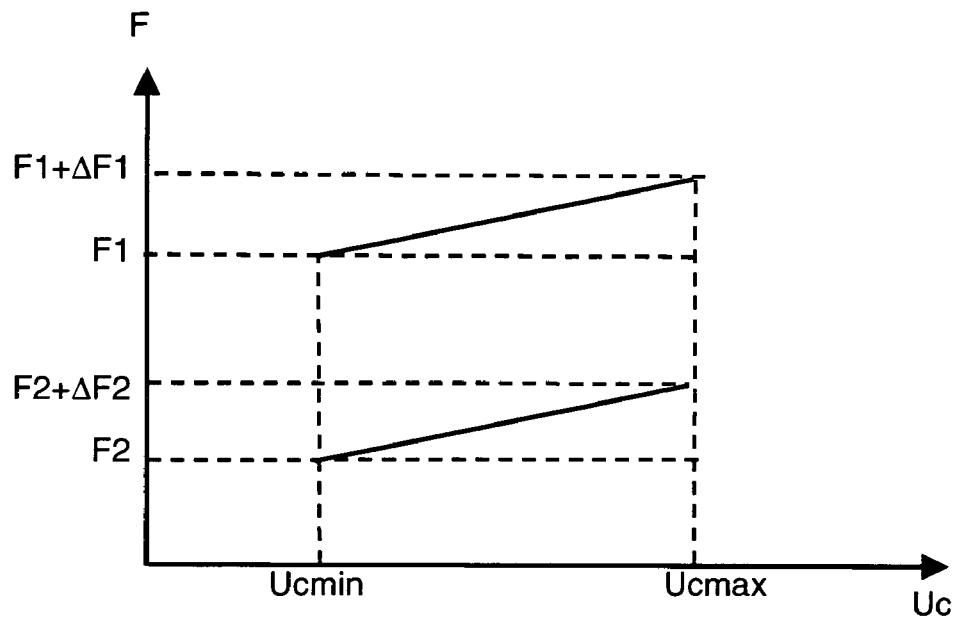
FIG. 3 illustrates the variations of the output frequency F of an oscillator according to FIG. 2 versus its control voltage Uc.
Figure 4:
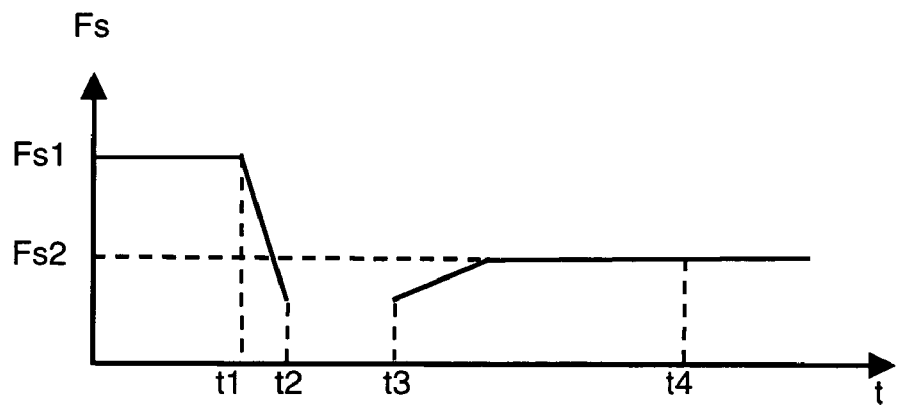
FIGS. 4 and 5 illustrate the variations, versus time, respectively of the output frequency Fs of a phase lock loop using a voltage controlled oscillator according to the prior art and of the control voltage Uc of the oscillator when changing frequency bands.
Figure 5:
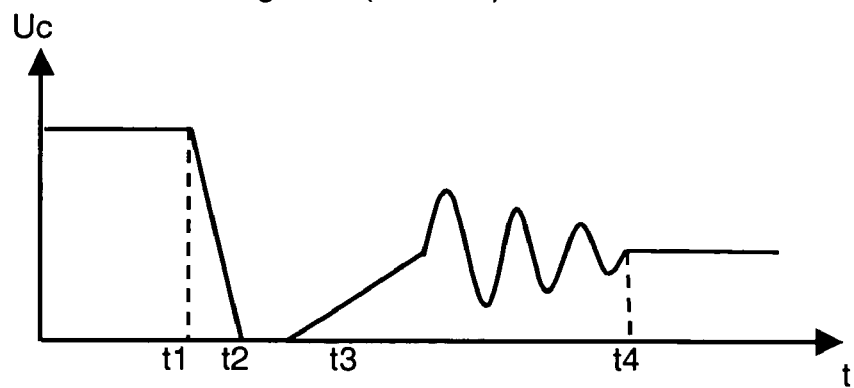
Figure 11:
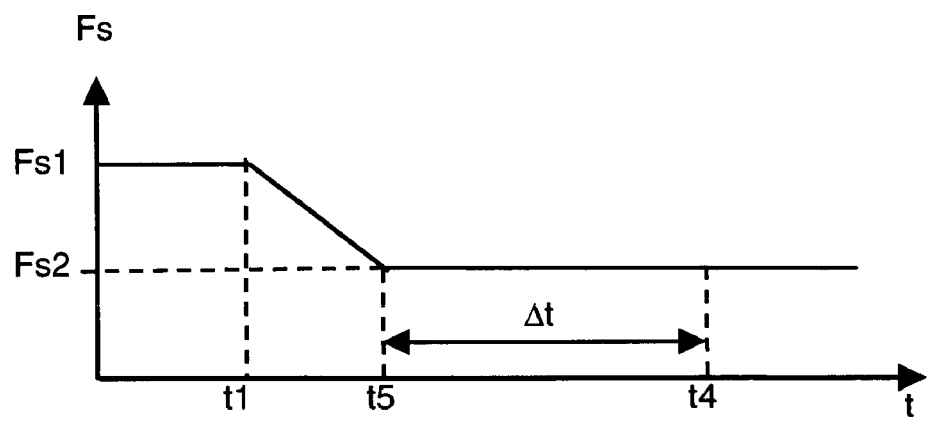
FIGS. 11 and 12 illustrate the variations, versus time, respectively of the output frequency Fs of a phase lock loop using a multiband voltage controlled oscillator according to the invention and of the control voltage Uc of the oscillator when changing frequency bands.
Figure 12:
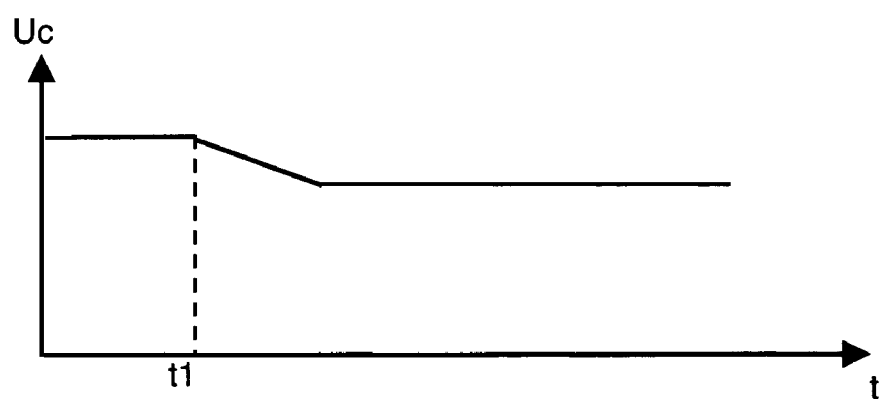

When such a multiband voltage controlled oscillator is used in a phase lock loop, there is no pulling out of synchronism of the loop when switching from one frequency band to another, due to the alternation of the variable capacitors. FIGS. 11 and 12 illustrate the variations versus time respectively of the output frequency Fs of the phase lock loop and of the control voltage Uc of the voltage controlled oscillator according to the invention included in the phase lock loop when switching from a frequency Fs1 of a first frequency band to a lower frequency Fs2 of a second frequency band. As in FIGS. 4 and 5, the fixed capacitor is connected in the system at time t1. The control voltage Uc decreases linearly up to a time t5 when the output frequency reaches the required new stable value Fs2. During this time interval, the variable capacitors Cv+ and Cv− have been alternately connected in the oscillating system depending on the value of the output frequency Fs. The time t5 when the output frequency is obtained is considerably prior to the corresponding time t4 in phase loops using a known multiband voltage controlled oscillator (FIGS. 4 and 5). The use of a multiband oscillator according to the invention thus enables a time saving $\Delta t = t4 - t5$ on switching. There is no voltage jump and no pulling out of synchronism of the phase lock loop. Furthermore, the absence of sharp variations of the control voltage on switching enables the noise generated when switching takes place to be reduced.

The invention claimed is:

1. Voltage controlled oscillator comprising an oscillating system with a first variable capacitor having a capacitance varying according to the control voltage of the oscillator, oscillator comprising a second variable capacitor having a capacitance varying according to the voltage applied thereto, switching means connected to the first and second variable capacitors, and control means for controlling the switching means causing, according to the output frequency of the oscillator, one of the variable capacitors to be replaced by the other in the oscillating system, the capacitance of one of the variable capacitors varying in the same direction as the voltage that is applied thereto and the capacitance of the other variable capacitor varying in the opposite direction to the voltage that is applied thereto, wherein the maximum oscillation frequency of the system with said first variable capacitor is equal to or lower than the minimum oscillation frequency of the oscillating system with said second variable capacitance.

2. Oscillator according to claim 1, wherein an operating frequency band of the oscillator is divided into at least two parts in which the frequency varies alternately in the same direction as the control voltage and in the opposite direction.

3. Oscillator according to claim 1, wherein the control means comprise means for supplying to the switching means a switching signal causing changing of the variable capacitor in the oscillating system when the output frequency of the oscillator reaches a predetermined switching value corresponding to the maximum oscillation frequency of the oscillating system with one of the variable capacitors.

4. Oscillator according to claim 3, comprising at least one additional capacitor, of fixed predetermined capacitance, and additional switching means connected in series with the additional capacitor to selectively connect the additional capacitor in the oscillating system or remove it therefrom.

5. Oscillator according to claim 4, wherein the capacitance of the additional capacitor is such that connection thereof in the oscillating system causes switching of the oscillator from one operating frequency band to a lower band.

6. Voltage controlled oscillator comprising:
an oscillating system with a first variable capacitor having a capacitance varying according to the control voltage of the oscillator;
oscillator comprising a second variable capacitor having a capacitance varying according to the voltage applied thereto;
switching means connected to the first and second variable capacitors, and
control means for controlling the switching means causing, according to the output frequency of the oscillator, one of the variable capacitors to be replaced by the other in the oscillating system, the capacitance of one of the variable capacitors varying in the same direction as the voltage that is applied thereto and the capacitance of the other variable capacitor varying in the opposite direction to the voltage that is applied thereto,
wherein the control means comprise means for supplying to the switching means a switching signal causing changing of the variable capacitor in the oscillating system when the output frequency of the oscillator reaches a predetermined switching value corresponding to the maximum oscillation frequency of the oscillating system with one of the variable capacitors,
wherein the control means further comprises means for supplying a switching signal to the additional switching means to cause an additional capacitor to be connected in the oscillating system when the output frequency of the oscillator reaches one of said switching values, the capacitance of said additional capacitor being such that the maximum oscillation frequency of the system with said additional capacitor is equal to or lower than the minimum oscillation frequency of the oscillating system without said additional capacitor;
further comprising at least one additional capacitor, of fixed predetermined capacitance, and additional switching means connected in series with the additional capacitor to selectively connect the additional capacitor in the oscillating system or remove it therefrom.

7. Oscillator according to claim 1, wherein the oscillating system comprises an amplifier connected in parallel with an inductor between a control input of the oscillator and an output of the oscillator, the capacitors being respectively connected in series with the corresponding switching means between the control input and the output of the oscillator.

8. Oscillator according to claim 7, wherein the switching means comprise a changeover switch comprising a common terminal connected to one end of the inductor and two terminals respectively connected to first ends of the first and second variable capacitors.

9. Oscillator according to claim 1, wherein the first and second variable capacitors are formed by transistors respectively of PMOS and NMOS type.

* * * * *